United States Patent [19]
Alidina et al.

[11] Patent Number: 6,064,714
[45] Date of Patent: May 16, 2000

[54] SHIFTER CAPABLE OF SPLIT OPERATION

[75] Inventors: Mazhar M. Alidina, Allentown; Geoffrey Francis Burns, Macungie, both of Pa.; Sivanand Simanapalli, Santa Clara, Calif.

[73] Assignee: Lucent Technologies Inc., Murray Hill, N.J.

[21] Appl. No.: 09/126,991

[22] Filed: Jul. 31, 1998

[51] Int. Cl.$^7$ .................................................. G11C 19/00
[52] U.S. Cl. .............................. 377/69; 377/64; 377/77; 377/81
[58] Field of Search ................................. 377/69, 77, 81, 377/64

[56] References Cited

U.S. PATENT DOCUMENTS

| | | | |
|---|---|---|---|
| 4,109,310 | 8/1978 | England et al. | 364/200 |
| 5,590,348 | 12/1996 | Phillips et al. | 395/564 |
| 5,675,584 | 10/1997 | Jeong | 370/284 |

Primary Examiner—Margaret R. Wambach
Attorney, Agent, or Firm—Brown Raysman Millstein Felder & Steiner LLP

[57] ABSTRACT

A device for shifting data in a cascade multiplexer shifter allows the shifter to be used in a full-length mode or in a split mode where the shifter is divided into two equal halves with upper and lower half fields thereof respectively receiving individual data numbers. Each data number is thereafter simultaneously shifted right or shifted left a given shift amount to effect a dual right or dual left shift function.

30 Claims, 9 Drawing Sheets

SHIFTER CAPABLE OF SPLIT OPERATION

BACKGROUND OF THE INVENTION

The present invention relates to shifters and, more particularly, to an improvement in a shifter which increases its efficiency and allows it to be used to shift two or more distinct data words at once.

Shifters and accumulators are well-known in microcontrollers, microprocessors, and digital signal processors. One use of a shifter is to shift a data string or word a particular shift amount. For purposes of the present discussion, it should be understood that each element of the data string will be referred to as a bit with the serial arrangement of the collection of such bits being referred to as a data string, word or number.

Shifters can support many different types of shift modes including, for example, arithmetic shifting, logical shifting, or barrel shifting. FIGS. 1a–1d illustrate schematically different types of shifts typically performed by a shifter. The shifts in FIGS. 1a–1c can be represented by instructions as follows:

For FIG. 1a: aD=aS<<ar
For FIG. 1b: aD=aS>>ar
For FIG. 1c: aD=aS>>>ar

For the above listed expressions, aS stands for a source accumulator in which a data word is originally stored, aD stands for a destination accumulator where the shifted word or number is stored, and ar stands for an auxiliary register that contains the shift amount. The notations "<<" and ">>" indicate arithmetic shifts left and right, respectively, and the notation ">>>" indicates a logical shift right.

FIGS. 1a–1c show graphically the implementation of these instructions in standard shifting techniques. The device indicated generally as 10 has a source accumulator indicated generally as 12 which is capable of a 32 bit capacity with bits numbered from 0 to 31. The output from the shift falls to the destination accumulator indicated generally as 14. Depending on the type and amount of shift made, the data string in the destination accumulator 14 can vary, with FIGS. 1a–1c illustrating exemplary shifts.

For example, as illustrated in FIG. 1a, an arithmetic shift left occurs in accordance with the first instruction. In so doing, the bits in the source accumulator 12 are shifted leftwardly the specified amount and bits of value 0 are shifted into the destination accumulator starting at bit 0. Conversely, as illustrated in FIGS. 1b and 1c, a shift right instruction causes the data word to be displaced such that the leftmost places in the destination accumulator 14 starting at bit 31 move in the right direction by the designated shift amount. In the case of the arithmetic shift right function of FIG. 1b, the sign bit s stored in bit 31 is shifted into the blank spaces left by the bits shifted right. In a logical shift right instruction as illustrated in FIG. 1c, the shifting of the data string or number is done similarly except that the open or blank spaces otherwise occupied by the data number (namely, bit 31 moving rightwardly therefrom the shift amount) receive a value of 0. A logical shift left produces the same result as in the arithmetic shift left shown in FIG. 1a.

A right barrel shift is illustrated in FIG. 1d. In a barrel shift, the bits 15a shifted out of the data word at the right or lower end are shifted into the open spaces 15b at the left or upper end of the word.

A shifter for implementing the shifts described above is shown in FIG. 2. FIG. 2 illustrates a standard cascaded multiplexer identified generally as 16 which connects a 32 bit length source accumulator 20 with bit places 0 through 31 (including lower half 0 through 15 and upper half 16 through 31) and a 32 bit length destination accumulator 24 with bit places 0 through 15 and 16 through 31. The cascaded multiplexer 16 includes a plurality of multiplexers or multiplexer stages 18 . . . 18"". The data word from the source accumulator 20 is input to the first multiplexer stage 18 which is capable of causing a 16 bit shift right or left or no shift at all. The single data string output from the last multiplexer stage 18"" is input to the destination accumulator 24. The shifted data word could have as few as a single informational bit from the original data word (excluding logic or sign extend elements), depending on how many shifts occur at each stage.

Several user settable controls control the operation of the shifter. An auxiliary register 30 contains the shift amount for the entire shift. Each bit in the auxiliary register 30 controls whether a given stage involved in the shift is performed. A left/right control 32 controls the direction of the shift. A sign extend control 34 controls whether the sign bit is extended in a right shift or whether 0's are shifted into the open bit spaces.

The operation of the standard cascaded multiplexer 16 involves the first multiplexer 18 producing a 16 bit left, a 16 bit right or an unshifted version of the single number received from the source accumulator 20. The next stage 18' receives bits 26 output by the prior stage 18 and produces an 8 bit left, 8 bit right or unshifted version of the output of the previous stage. This process continues through successive stages 18" . . . 18"" until the shifted number is output to the destination accumulator 24 in the desired shifted form as determined by the logic set in the auxiliary register 30. The m bit in the auxiliary register[m] controls whether or not a shift of $2^m$ bits occurs at each stage, and the left/right control 32 controls the direction of shift. That is, the cascaded logic in the auxiliary register 30 produces a shift amount equivalent to the encoded values of ar[4] ar[3] ar[2] ar[1] ar[0] and the 32 bit data word is shifted as a whole by that amount.

In the prior art shifter shown in FIG. 2, the lower bit shift left inputs, locations 0–15. of each stage are tied to 0 while the upper shift right inputs, locations 16–31, include additional multiplexing to support sign or zero extending. Each bit location or splice in each multiplexer stage receives several inputs from the prior stage and selects among those inputs based on the controls 30, 32, and 34. For example, FIGS. 2a–2c depict exemplary bit splices of the shift 2 stage 18'". As shown in FIG. 2a, the bit splice for the 31 bit, $a_{31}$, receives the following four inputs from the prior stage 18", which are selected based upon the controls as follows: $a_{31}$ (selected for a shift right with sign extend), 0 (selected for a shift right without sign extend), $a_{31}$ (selected for no shift), and $a_{29}$ (selected for shift left). Similarly, FIG. 2b shows a bit splice for the $a_{29}$ bit, with inputs from the prior stage of the $a_{31}$ and $a_{27}$ bits for shifts right and left, respectively, and the $a_{29}$ bit for no shift. Finally, FIG. 2c illustrates the $a_0$ bit splice of the 2 shift stage 18'", which selects from inputs of the $a_2$ bit for a right shift, the $a_0$ bit for no shift, and 0 for a shift left.

As a result, the multiplexers 18 . . . 18"" in shifter 16 can effectively shift a data word contained in the source accunulator into a shifted data word output to the destination accumulator 24.

However, such cascaded multiplexers as shown in FIG. 2 are limited to the shifting of a single data string or word which occupies the full 32 bit source accumulator. In many applications, this becomes an inefficient way of utilizing the microcomputer. Many signal processing applications require reduced precision such as 16-bit precision, and the use of a 32 bit shifter to shift a 16-bit data string or word is inefficient and leaves the shifter underutilized. Indeed, the need to shift two 16-bit words would require the use of two 32 bit shifters, thus requiring additional resources and time to perform the operations. This problem becomes more pronounced when the disparity between shifter length and word length increases.

There is thus a need to reduce or eliminate the wasted capacity in existing shifters.

SUMMARY OF THE INVENTION

The problems described above are solved by, in preferred embodiments, a shifter and related shifting method whereby the shifter can selectively perform a full shift operation or, if desired, receive data in two or more distinct fields and perform two or more partial maximum bit capacity shift operations. This advantageously makes more efficient use out of the shifting device thereby improving on cost of manufacture and speed of operation.

More specifically, the shifter has one or more separators for selectively maintaining two or more data words separated in two or more fields during the shift operation. For example, a shifter in accordance with the invention may have capacity of an even number of bits and may be divided in two equal halves. In preferred embodiments, the shifter is capable of a double right or left arithmetic shift, a double logic shift left, or a double right or left barrel shift. The shifter also has controls which control the shifter during a shift operation, including a split mode control which causes the separators to select between keeping the fields separate or shifting all bits together, as a whole.

If the shifter is a cascaded multiplexing shifter, the separators comprise in preferred embodiments a plurality of split mode multiplexers connected between cascaded multiplexer stages. Each split mode multiplexer receives some of the bits output from one multiplexer stage in the cascaded multiplexer, selects between the bits based upon at least a split mode control, and outputs the selected bit to the next multiplexer stage in the cascade.

If the shifter is designed to separates two distinct data words, the shifter contains two types of split mode multiplexers, one used for lower field bits and one used for upper field bits. Each bit splice of the multiplexers associated with the lower half field of the shifter preferably includes three selection inputs one of which is selected for the shift right input of the following multiplexer stage. The lower field multiplexer selects between a bit from the upper field for a no split shift and either 0 or the lower data word sign bit for a split shift. Each bit splice of the multiplexers associated with the upper half field has two selection inputs and produces an output to the left shift input of the following cascaded multiplexer stage. The two inputs allow for selection of a bit from the lower data word for a no split shift or 0 for a split shift.

The use of the split mode multiplexers and split control thus allows for separation of the two data words being shifted by selectively preventing bits from each data word from entering the other data word. Alternatively, the multiplexing logic incorporated in the separate split mode multiplexers may be added to the cascaded multiplexer stages to the same result, with the split control being an additional input to the multiplexer stages.

For barrel shifting, additional ports are added to either the split mode multiplexers or cascaded multiplexer stages to capture bits from each end of the separated data words. These bits are selected based upon input from a barrel control.

A method of shifting data in a shifter in accordance with embodiments of the present invention comprises the steps of providing a shifter of a given bit length, assigning a first data number to one part of the shifter and another data number to another part of the shifter, and shifting each of the data numbers simultaneously within the shifter to affect a dual shift function of two distinct data numbers. The shifter preferably has an even number of bit places and the bit number places is divided by two to create two equal halves of the register. The shifter is selectively divided into two fields, lower and upper, or allowed to function as a full-length register.

In one embodiment, shifter controllers controllably vary the direction of shift and amount of shift and cause each distinct data number in the respective upper and lower fields of the shifter to be shifted in a cascaded manner a given number of times. Each of the data numbers can be right-shifted in respective upper and lower fields of the register to effect a dual right shift function and each of the data numbers can be leftshifted in respective ones of the upper and lower fields of the register to effect a dual left shift function.

DETAILED DESCRIPTION OF THE PREFERRED EMBODIMENTS

Figure 1A:
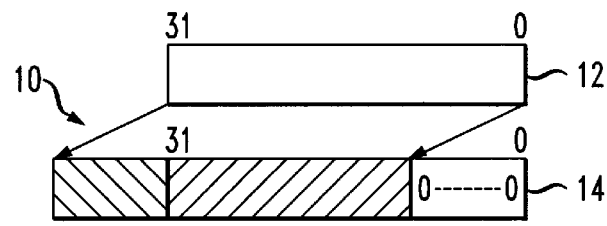
FIGS. 1a, 1b, 1c, and 1d illustrate different types of prior art shifts of a single data word.
Figure 1B:
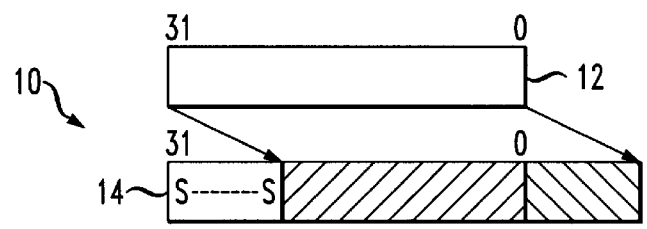
Figure 1C:
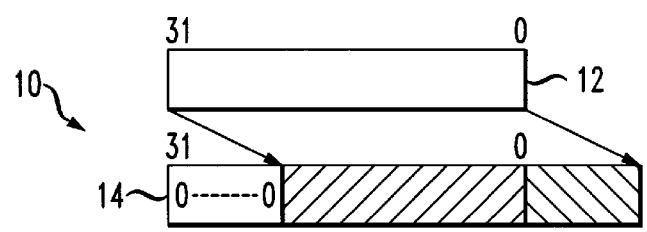
Figure 1D:
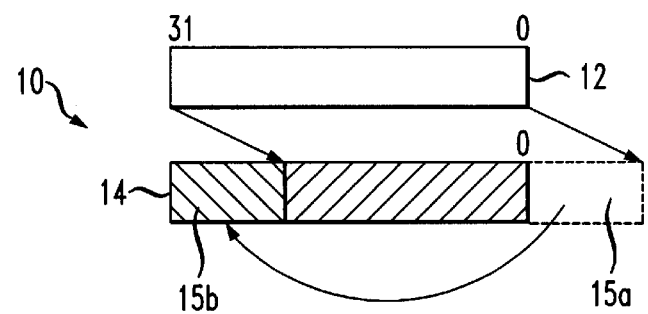
Figure 2:
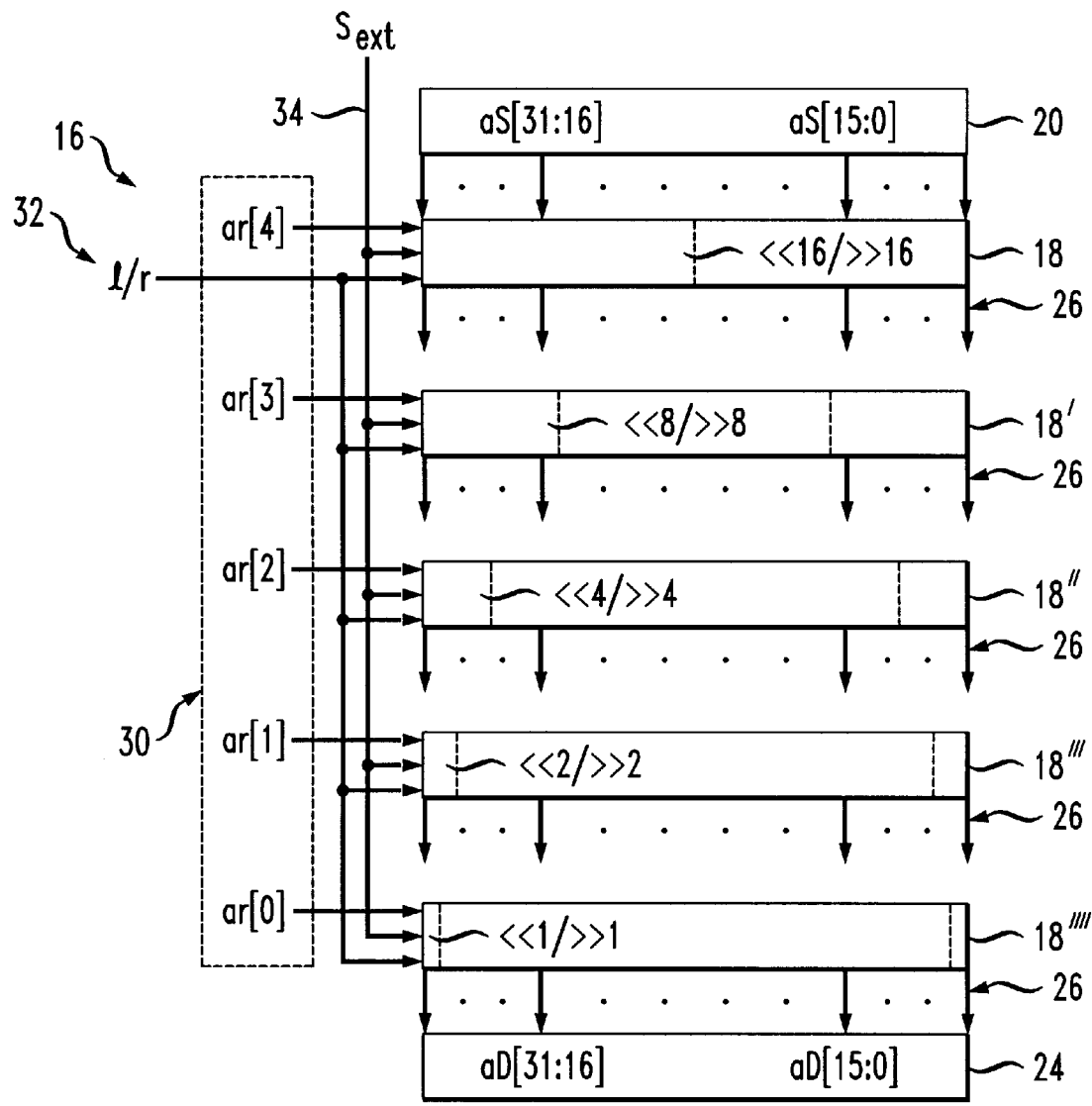
FIG. 2 illustrates a prior art cascaded multiplexer shifter with a 32 bit design.
Figure 2A:
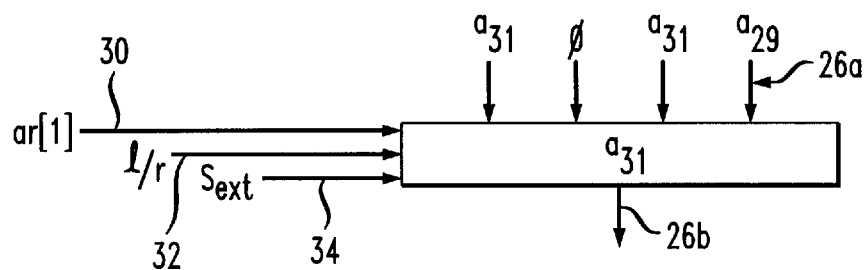
FIGS. 2a, 2b, and 2c illustrate exemplary bit splices of the 2 bit shift multiplexer stage of the shifter of FIG. 2.
Figure 2B:
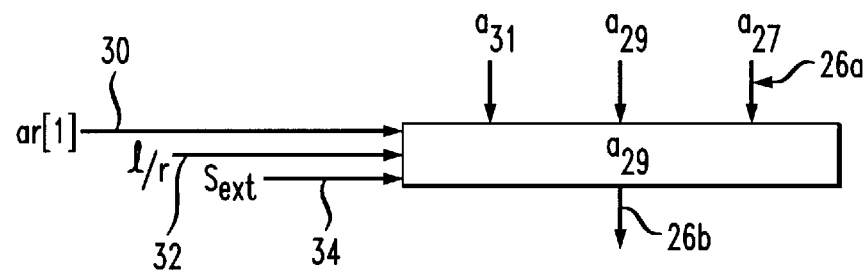
Figure 2C:
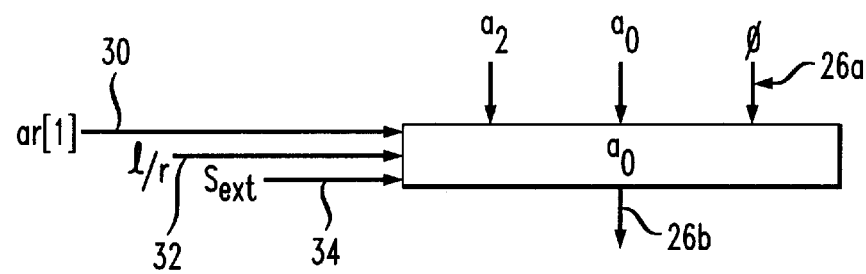
Figure 3:
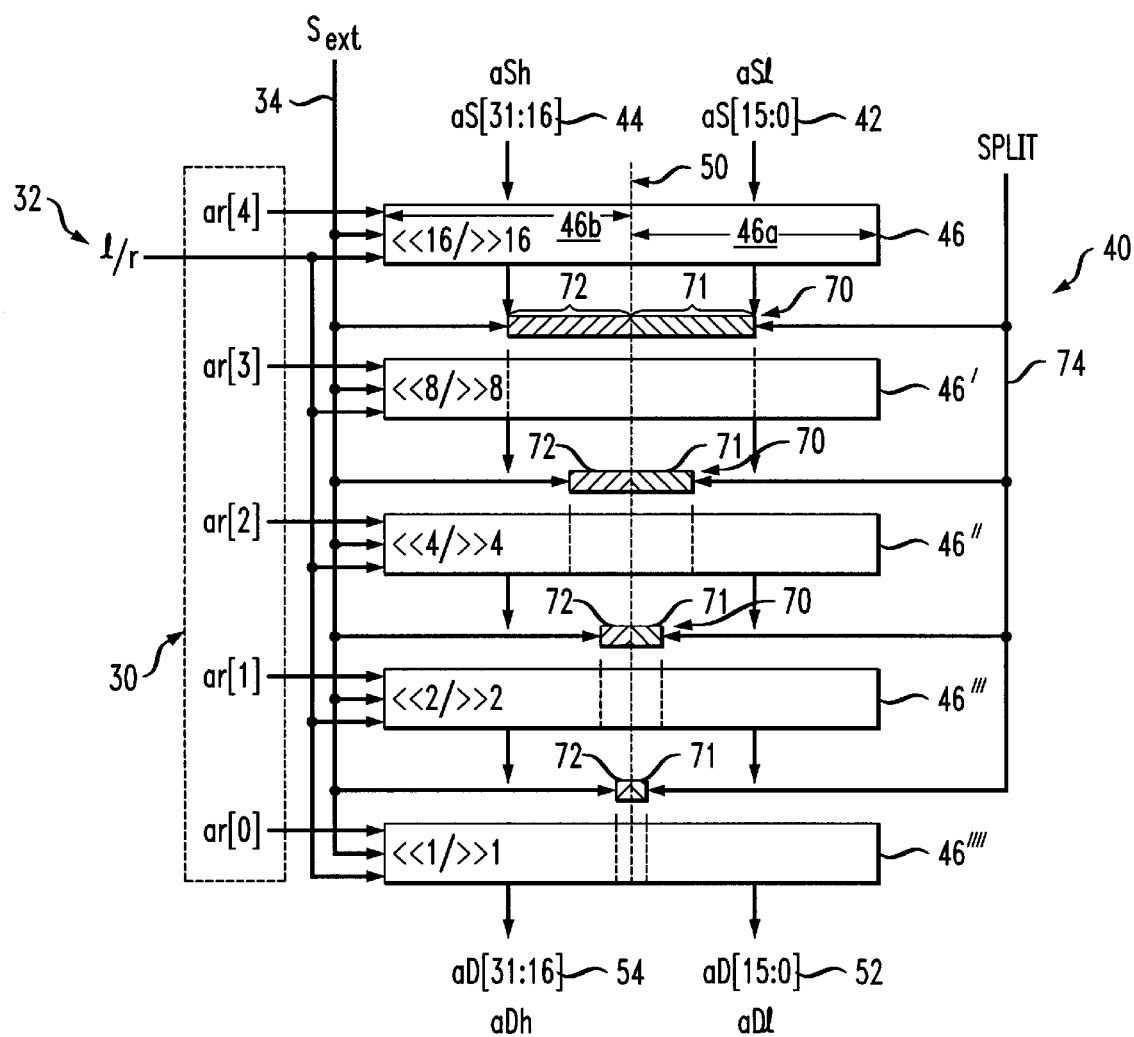
FIG. 3 illustrates a cascaded multiplexer shifter with multiplexing supporting the split shift mode of a preferred embodiment of the present invention.

A dual mode shifter and its operation is now described with reference to the drawings in FIGS. 3–8e. Referring to FIG. 3, a dual mode split shifter is shown and identified generally as 40. The shifter 40 has two modes of operation; it is capable of operating as a single full length shifter wherein a single full length data string is shifted right or left in a manner similar to that discussed above with reference to FIGS. 1a–1c, or as split shifter which is divided into two equal fields and two different half length data strings or numbers are input into each respective field of the divided shifter and are shifted as if in separate shifters. While not constrained by this, in the preferred embodiment of the invention the shifter 40 is a 32 bit length shifter, and the shifter 40 will be discussed in full 32 bit length terms for purposes of ease of illustrations and reference. As those skilled in the art will recognize, the shifter of the present invention may have any desired bit length capacity.

As seen in FIG. 3, the cascaded dual mode shifter 40 includes multiplexer stages 46 . . . 46''' having a full length capacity sufficient to accommodate a maximum length data string as may be required by a controller for a given application. The shifter 40 is connected to one or more source accumulators. The first multiplexer stage 46 receives as input either two 16 bit data words 42 and 44 or one 32 bit word comprised of data word halves 42, 44. The lower and upper halves of the source accumulator are referred to herein by the designations aSl and aSh, respectively. In between each pair of successive multiplexer stages 46 . . . 46''' are split mode multiplexers 71, 72 which receive some of the bits output from the prior stage and, through logic to be described in greater detail below, select one of the received bits to output to the next stage based upon whether the shifter 40 is operating in split mode or non-split mode. In this respect, it should be understood that when in the split mode, the two data words input to the multiplexer stage 46 and shifted in the shifter 40 are kept separated through logic effectively forming a dividing line 50 between the low and high halves, 46a and 46b, of each multiplexer stage.

Each data string or data string half 42, 44 is shifted by cascading from one multiplexer stage to the next, e.g., from multiplexer stage 46 to 46' . . . 46''', until two shifted data strings 52, 54 are ultimately output into one destination accumulator or two separate destination accumulators. The shifted 16 bit data string 52 is stored in the lower bit locations of a single destination accumulator, i.e., bit locations 0 through 15 of the destination accumulator designated herein as aDl, while the shifted 16 bit data string 54 is stored in the upper bit locations of the destination accumulator, i.e., bit locations 16 through 31 designated herein as aDh. Thus, it should be appreciated that each 16 bit number 42, 44 effectively cascades down from either side of the dividing line 50 independently of the other 16 bit number.

The split shifter 40 is controlled by a several controls as shown in FIG. 3. Auxiliary register or ar 30 contains the shift amount for the shifter, and each bit in the ar 30 controls whether a shift occurs at each one of the multiplexer stages 46, 46', 46'', 46''', and 46''''. Depending on the values in the auxiliary register 30, shifting may occur at every stage, in selected stages, or not at all. A shift of any number of bits in a full 32 bit word or each of two distinct 16 bit words may be performed by selectively setting the individual bits of ar[0] . . . ar[4]. Alternatively, the shift amount may be controlled by five separate shift controls not stored in a single register. A left/right control 32 is also provided to set the direction of shift, and a sign extend control 34 sets whether the sign bit is extended during a shift right.

A split control 74 controls whether the shifter is operated in split or non-split mode. In preferred embodiments, the split control is simply a bit which is set to select split mode, i.e., where a value of 0 represents non-split or fill shift mode and a value of 1 represents split mode.

Figure 4A:
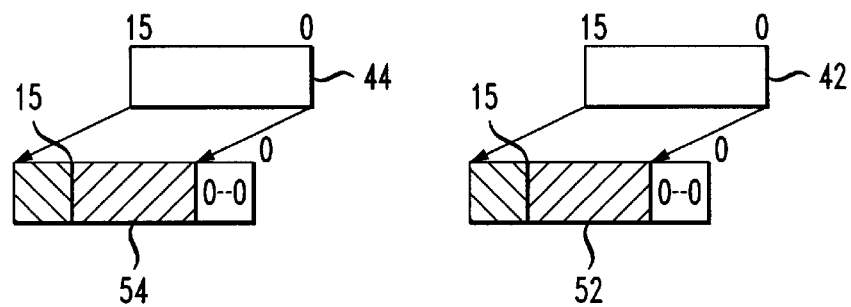
FIGS. 4a, 4b, and 4c, illustrate different modes of operation of the shifter of FIG. 3.
Figure 4B:
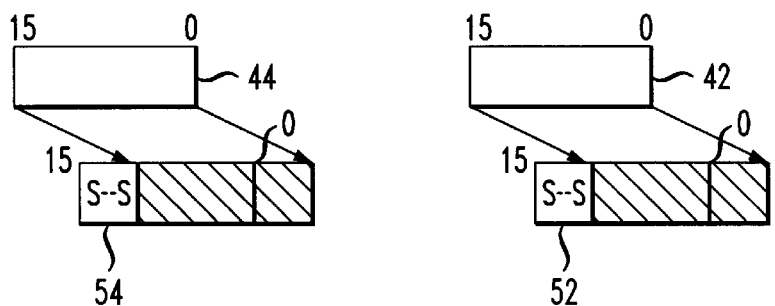
Figure 4C:
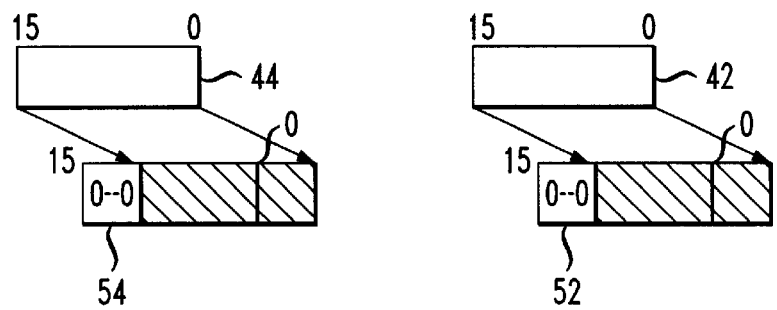

As illustrated in FIGS. 4a, 4b and 4c, the split shifter 40 shown in FIG. 3 is capable of performing several different shifting functions when in a split mode. In preferred embodiments, these functions are represented by the following instructions:

$$aDh=aSh<<ar\ aDl=aSl<<ar \quad (1)$$

$$aDh=aSh>>ar\ aDl=aSl>>ar \quad (2)$$

$$aDh=aSh<<<ar\ aDl=aSl<<<ar \quad (3)$$

That is, as seen from FIGS. 4a, 4b and 4c, the shifter 40 is capable of three types of dual shifts when set in the split shift mode. In FIG. 4a, a dual 16 bit arithmetic shift left is shown in accordance with instruction (1). That is, each number 42, 44 in residence in the high and low halves of the source accumulator is shifted left an equal shift amount specified in the ar 30. The resulting two shifted data words 52, 54 may be output to one or two destination accumulators.

As seen in FIG. 4b, a dual arithmetic shift right is performed in accordance with instruction (2) by shifting each 16 bit data word 42, 44 right an equal shift amount and separately extending the value of the sign bit of each 16-bit word 42, 44. That is, in the mode shown in FIG. 6b, each number 42, 44 in residence in the low and high halves of the source accumulator is shifted right a given shift amount and the sign value s of each number is shifted into the open bits.

In the mode illustrated in FIG. 4c, a dual logic shift right is performed in accordance with instruction (3) by shifting in the value 0 into the open bits of each data word 42, 44 as it is shifted right. That is, each number 42, 44 in residence in the low and high halves of the source accumulator is shifted right an equal given shift amount and the opened bit spaces receive 0's during the shift operation.

Figure 4D:
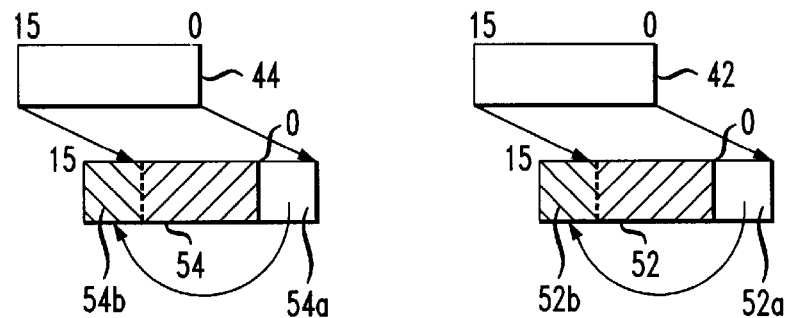
FIG. 4d illustrates a barrel shift of two data words in a split shifter as shown in FIG. 3 having additional barrel shifting capabilities.

If barrel shifting capabilities are added to the shifter 40 as described in greater detail below, a dual barrel shift operation may be performed on the two distinct data words 42, 44 as shown in FIG. 4d. As the two data words 42, 44 are shifted, the bits 52a, 54a shifted out of one end of each data word are shifted into the open spaces at the opposite end 52b, 54b respectively. The result is two barrel shifted data words 52, 54.

Referring again to FIG. 3, the shifter 40 contains a multiplexing assembly 70 provided between each stage 46, 46', 46'' . . . 46'''' for allowing passage of bits between the upper and lower multiplexer stage halves 46a and 46b when the shifter 40 is used as a full length register and for correcting and keeping separate the fields of the two numbers 42, 44 when the shifter 40 is used in a split mode. The multiplexing assembly 70 includes a plurality of split mode multiplexers 71 and 72 respectively associated with the lower and upper halves of the shifter 40. The low side multiplexer 71 is connected between bits at the output of the previous multiplexer stage 46 . . . 46''' and the shift right input of the next multiplexer stage. The low side multiplexer selects one of the bits based upon the split control 74 and sign extend control 34. Similarly, the high side multiplexer 72 is connected between bits at the output of the previous multiplexer stage 46 . . . 46''' and the shift left input of the next or succeeding stage. The high side multiplexer 72 selects one of the bits based upon the split control 74.

The multiplexing assembly 70 prevents bits from each data word 42, 44 from transferring to the other word during a split shift operation thus effectively separating the fields defining each 16 bit data word.

Figure 5A:
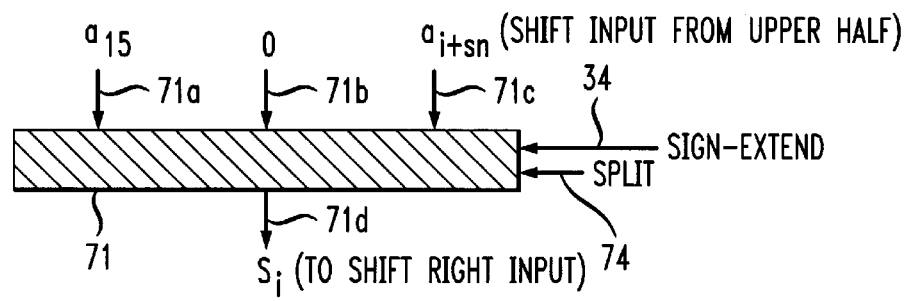
FIG. 5a illustrates a bit slice of a split mode multiplexer associated with lower end bits of the shifter of FIG. 3.
Figure 5B:
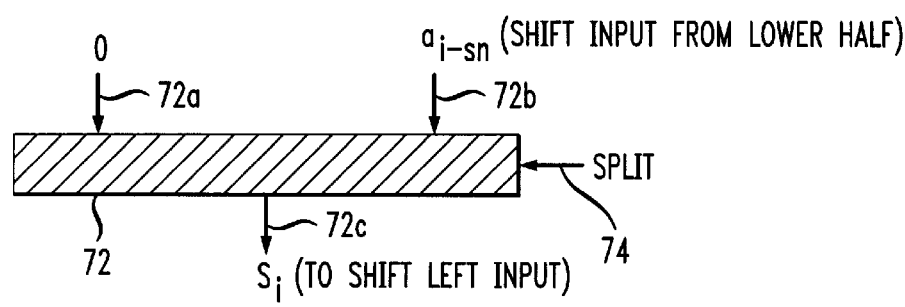
FIG. 5b illustrates a bit slice of a split mode multiplexer associated with upper end bits of the shifter of FIG. 3.

Bit splices of the split mode multiplexers 71, 72 are illustrated in FIGS. 5a and 5b. Referring to FIG. 5a, each bit of the low side multiplexers 71 receives values on three input lines 71a, 71b, 71c, produces an output on an output line 71d, and is controlled by two controls 34 and 74. The three input lines 71a, 71b, 71c respectively correspond to and are selected in a split mode with arithmetic shift, a split mode with logical shift, or a non-split mode, based on the split control 74 and sign extend control 34 which are selectively set.

In particular, input line 71a is connected to receive the $a_{15}$ bit from the prior stage, which represents the sign bit of the lower data word 42. This input line 71a is selected during a dual split arithmetic shift right, i.e., when the split control 74 and sign extend control 34 are both set. This causes the value in residence at the $a_{15}$ or sign bit in the lower data word 42 to be shifted into the vacated places otherwise occupied by a portion of the now shifted data word, thus extending the sign bit for the lower data word 42. Input line 71b receives the value 0, and is selected in a dual split logical shift right, i.e., when the split control 74 is set and the sign extend control 34 is not set. This causes 0 values to be shifted into the empty bits of the lower data word 42 when the instruction calls for a logical dual shift right function.

Finally, the input line 71c contains the value found at position $a_{i+sn}$, of the prior multiplexer stage, where i is the bit position of the succeeding multiplexer stage to which the output of the split mode multiplexer 71 is input and sn is the shift amount for the succeeding multiplexer stage. For example, for the $a_{12}$ location of a low side split mode multiplexer 71 situated between the ar[3] stage 46' and ar[2] stage 46", input line 71c contains the $a_{16}$ bit from multiplexer stage 46' which is the $a_0$ value of the high half string, and this value is output to the $a_{12}$ location of the 4 shift multiplexer stage 46". This allows normal, full 32 bit shift capability and does not keep the fields separate for the two data words.

Put another way, the split control 74 causes the multiplexer 71 to select an input from either of the lines 71a or 71b, thus preventing the value $a_{i+sn}$ from the upper data word 44 from entering the lower data word 42. In the absence of a split instruction on control 74, the shifter 40 operates as a full length, non-split shifter, with input taken from the upper data word 44 over line 71c. The sign extend control 34 corresponds to instructions for a sign-extended or arithmetic shift right mode and causes the multiplexer 71 to select between input lines 71a and 71b when control 74 is set in split mode.

Figure 6A:
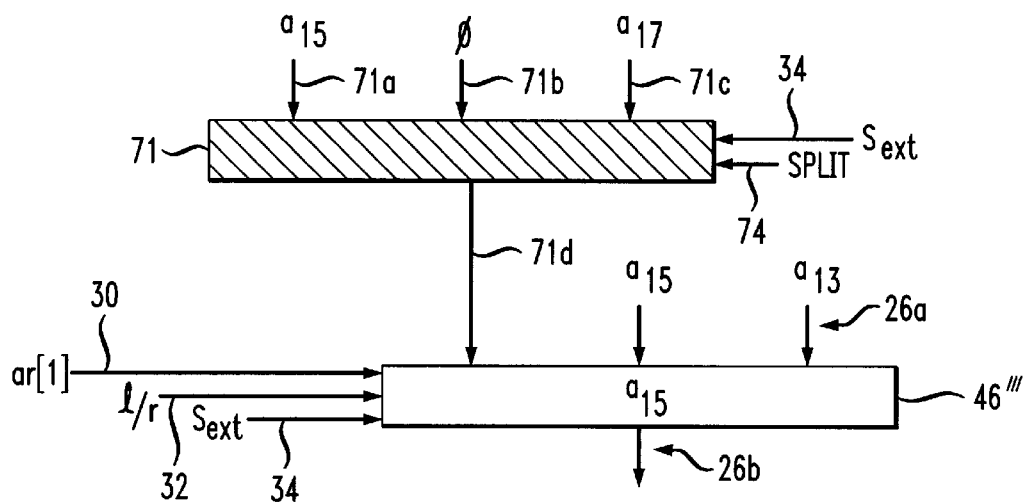
FIG. 6a illustrates a bit splice of a split mode multiplexer and associated cascaded multiplexer for a 2 shift stage for the upper bit of the lower data word being shifted by the shifter of FIG. 3.

FIG. 6a illustrates an exemplary bit splice from the split mode multiplexer 71 connected between the ar[2] multiplexer stage 46" and the ar[1] stage 46'" and corresponding to the $a_{15}$ bit of the succeeding multiplexer stage 46'". As shown in the drawing, the $a_{15}$ bit of the multiplexer 46'" receives as input the $a_{15}$ bit from the prior stage for a no shift instruction, the $a_{13}$ bit from the prior stage for a shift left, and the output 71d from the bit splice of split mode multiplexer 71 for a shift right. The multiplexer selects one of these three inputs for output to the next stage based on the values of bit ar[1] of the auxiliary register 30 and the left right control 32, as described above in relation to existing cascaded shifters. The output 71d is produced by the multiplexer bit 71 selecting one value among the three input lines 71a, 71b, and 71c containing, respectively, the $a_{15}$ bit of the prior stage 46" representing the sign bit of the lower data word 42, 0 for a logical shift of the lower data word 42, and the $a_{17}$ bit from the prior stage 46" for a full, non-split shift. The multiplexer 71 selects among these three input values based upon the split and sign extend controls 74 and 34, as explained above.

Referring now to FIG. 5b, it should be seen that a bit splice from the upper half multiplexer 72 has two input selections, namely lines 72a and 72b. The multiplexer 72 selects one of these for output on output line 72 and receives split control 74 for making such selection. The output 72c of the multiplexer is connected to the shift left input of the succeeding multiplexer stage. The input lines 72a, 72b correspond respectively to left arithmetic shifting of the upper data word 44 and to non-split shifting. That is, if there is a split command on line 74, and the value of 0 on input line 72a selected for output on line 72c to the left shift input of the succeeding multiplexer stage. If the left/right control is set for a left shift, the multiplexer stage will select the input over line 72c and a 0 will be shifted in each vacated place in the upper data word starting from the dividing line 50 and moving left. If there is no split logic on line 74, then the input on line 72b is selected and the value $a_{i-sn}$ is taken from the shifted portion of the data string which flows over past the dividing line 50 from the lower data word. That is, the shifter 40 will behave in a shift left function for a 32 bit mode and the inputted value for position $a_i$ will be taken from $a_{i-sn}$ of the low data word (counting in full length) such that for example, the value of the $a_{15}$ place of the lower data word, in a 4 bit left shift, will occupy the $a_{19}$ bit location of the full 32 bit data string, which is the $a_3$ position in the upper half of the data word.

Figure 6B:
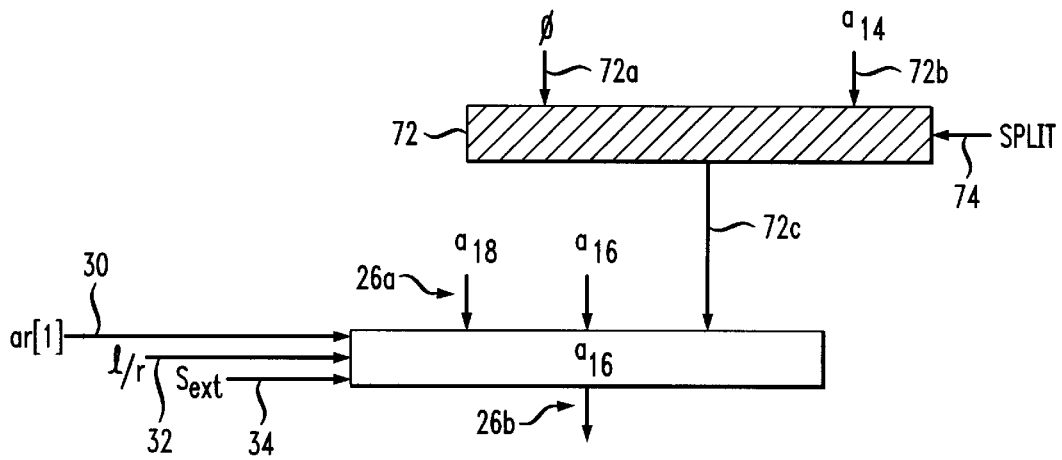
FIG. 6b illustrates a bit splice of a split mode multiplexer and associated cascaded multiplexer for a 2 shift stage for the lower bit of the upper data word being shifted by the shifter of FIG. 3.

FIG. 6b illustrates an exemplary bit splice from the split mode multiplexer 72 connected between the ar[2] multiplexer stage 46" and the ar[1] stage 46'" and corresponding to the $a_{16}$ bit of the succeeding multiplexer stage 46'". As shown in the drawing, the $a_{16}$ bit of the multiplexer 46'" receives as input the $a_{16}$ bit from the prior stage 46" for a no shift instruction, the $a_{18}$ bit from the prior stage for a shift right, and the output 72c from the bit splice of split mode multiplexer 72 for a shift left. The multiplexer selects one of these three inputs for output to the next stage based on the values of bit ar[1] of the auxiliary register 30 and the left right control 32. The output 72c is produced by the multiplexer bit 72 selecting one of the two input lines 72a, 72b, containing, respectively, 0 for a left shift of the lower data word 42 and the $a_{14}$ bit from the prior stage 46" for a full, non-split shift. The multiplexer 72 selects among these three input values based upon the split control 74.

Referring again to FIG. 3, the shifter 40 contains split mode multiplexers of the types just described at the border between the two data words to prevent data from each data word from crossing over into the other data word during a split shift. Because smaller shifts are possible at each successive stage, the number of bits needed for the split mode multiplexers decreases accordingly. Thus for example, 16 multiplexer bit places are needed between the ar[4] stage 46 and ar[3] stage 46' to account for and correct inputs to a possible 8 bit shift in either direction in the ar[3] stage 46'. Similarly, 8 bit places are needed before the ar[2] stage 46", 4 bit places before the ar[1] stage 46'", and 2 bit places before the ar[0] stage 46"".

Because a shift in the ar[4] stage is only useful in full, non-split shift mode, a split mode multiplexer assembly 70 is not required prior to the ar[4] stage 46. Indeed, a shift in the ar[4] stage 46 results in loss of 16 bits which, when in split mode, results in loss of an entire 16 bit data word. If barrel shifting is performed, a shift in the ar[4] stage 46 merely results in swapping of the two 16 bit data words. Of course, the ar[4] stage 46 is needed in the event of a full, non-split shift.

Figure 7:
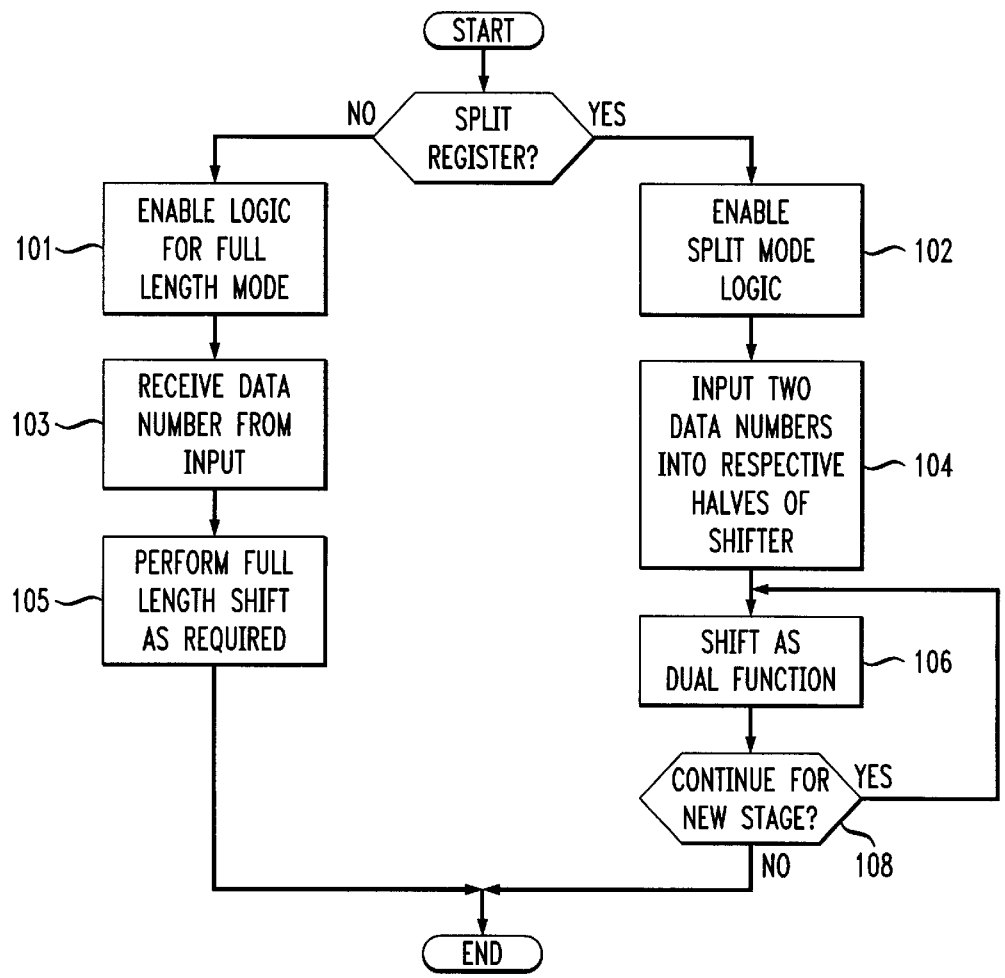
FIG. 7 is a flowchart showing the general operation of the shifter of FIG. 3.

As illustrated by the flow chart shown in FIG. 7, the general process of one embodiment of the present invention may be seen as follows. First, a selection is made (step 100) to determine whether the shifter should be used in its full length capacity, e.g., as a 32 bit shifter, or used as two half length shifters, e.g., as two 16 bit upper and lower half shifters. If the decision is made to use the shifter as a full 32 bit register, the split mode multiplexers are enabled as described above with respect to a non-split mode (step 101), and the data word from the source accumulator is inputted into the first multiplexer stage 46 and is thereafter shifted as a single word length (step 103) by selecting the data word data bits from in the split mode shifters, as described above. Shifting is done as called for by the auxiliary register and left/right control logic (step 105).

However, if the desired mode of the shifter is a dual 16 bit shifter, then the appropriate input is made to the logic lines causing the two 16 bit low and high data words to operate without any bridging (step 102). Data representing each of two separate data words are inputted from one or more source accumulators to the low and high halves of the shifter. (Step 104) Instructions in the controls operate the shifter, depending upon the value at each bit of the auxiliary register, each of the upper and lower half numbers are shifted either right or left a certain number of bits or pass through to the next stage without shift, with the bits from each data word kept separate from the other. (Step 106) This process is continued for the successive stages, of the shifter (Step 108). This occurs sequentially until the finally-shifted values cascade to the destination accumulator where each is maintained for further processing.

By the foregoing a novel and nonobvious shifting device and method has been disclosed by way of preferred embodiments. Numerous modifications and substitutions may be had without departing from the spirit of the invention. For example, while the preferred embodiment discusses a 32 bit shift register, it is wholly within the purview of the invention to contemplate larger length registers which can be divided into and used between full-length shifting functions and dual-half-length functions in the manner as set forth above.

Similarly, the use of an additional, separate auxiliary register for each 16 bit data word as well as additional split mode multiplexers of the type described herein will provide the ability to shift each data word in any given direction independent of the other data word. In addition, the shifter may be divided into more than two data words, or data words of unequal length, by providing split mode multiplexers in the necessary bordering locations between multiplexer stages to keep the fields of the data words properly separated.

Figure 8A:
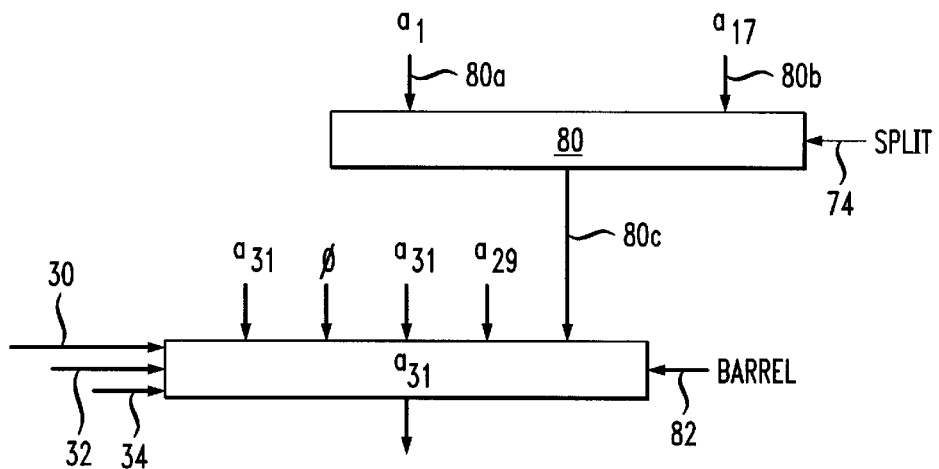
FIGS. 8a–8e illustrate exemplary bit splices of the shifter of FIG. 3 modified to have barrel shifting capabilities.
Figure 8B:
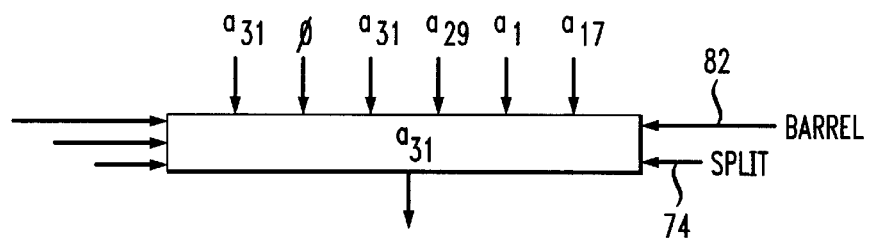

Furthermore, barrel shifting capabilities may be added to the shifter to allow for dual mode barrel shifting as shown in FIG. 4*d*. To allow for barrel shifting, additional ports or inputs are added to the multiplexer stages to capture bits from each end and wrap them around to the opposite end. FIGS. 8*a*–8*e* contain exemplary modified bit splices for the ar[1], 2 shift stage of FIG. 3. As shown in FIG. 8*a*, for the $a_{31}$ bit the $a_1$ and $a_{17}$ bits are connected as inputs 80*a* and 80*b* to an additional multiplexer 80 for use in barrel shifting. If the split control 74 is set, the $a_{17}$ bit is selected to thus wrap the bit at the low end of the upper data word around to the high end. If the split control is not set, the $a_1$ bit is selected to wrap the bit at the low end of the entire 32 bit data word around to the high end. A barrel control 82 is set to select the bit output by multiplexer 80 over line 80*c* to thus effectuate barrel shifting. FIG. 8*b* shows an alternative manner of implementing the logic of FIG. 8*a*, wherein all inputs are input directly to one modified multiplexer which then selects one based on all controls.

Figure 8C:
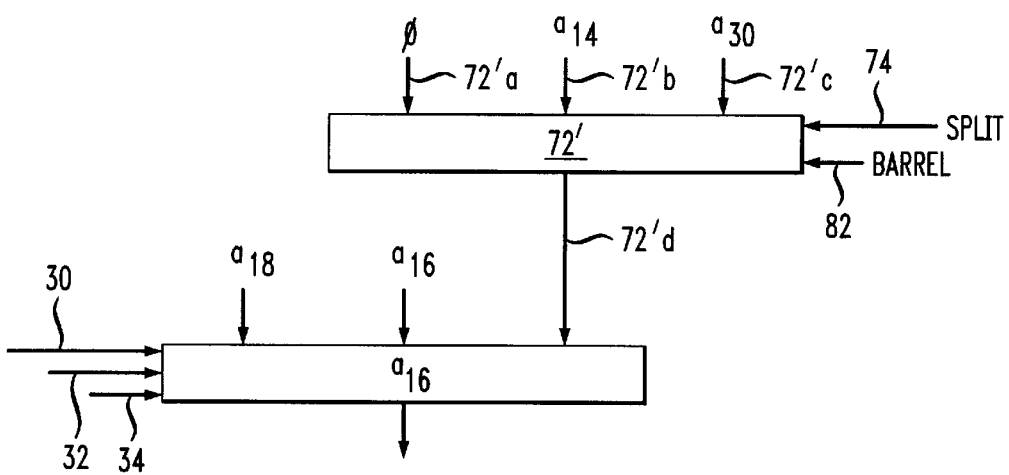
Figure 8D:
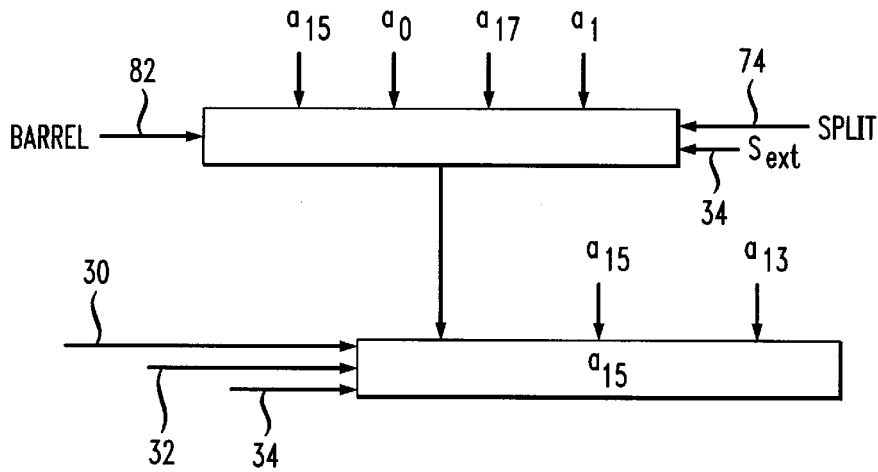
Figure 8E:
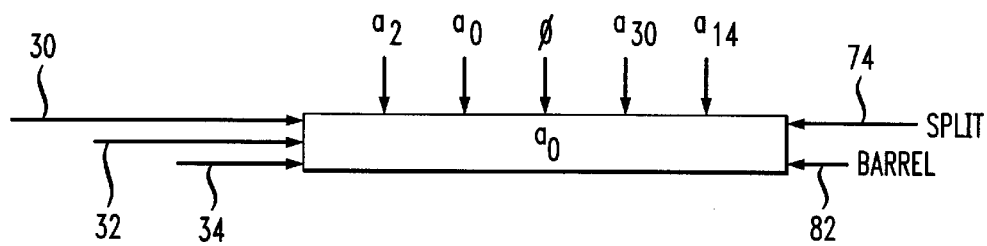

As additional examples, FIG. 8*c* shows a modified high end split mode multiplexer 72' having inputs 72*a*' and 72*b*' which are the same as inputs 72*a* and 72*b* of FIG. 6*b* and an additional barrel shifting input 72*c*' for use in split shift mode, and FIG. 8*d* shows a similarly modified low end split mode multiplexer. FIG. 8*e* illustrates a modified single step multiplexer bit splice for ao which allows for split and barrel shifting.

Figure 9:
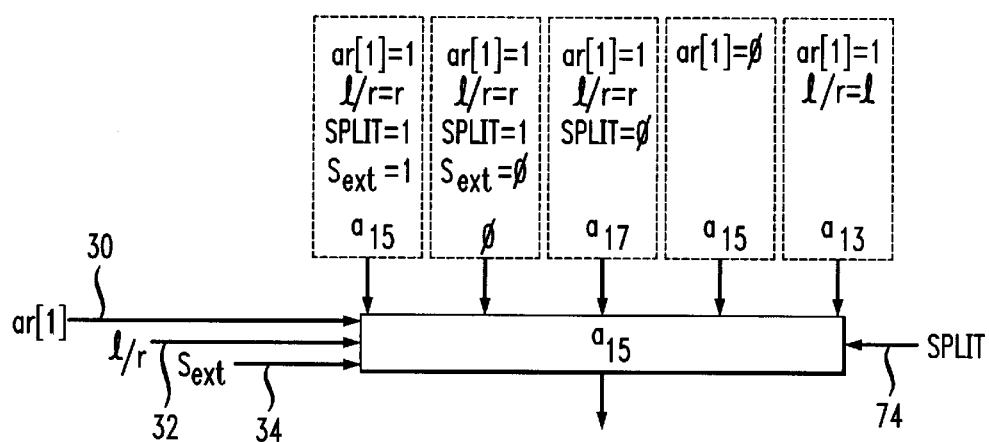
FIG. 9 illustrates a bit splice which is an alternative to the bit splice shown in FIG. 6b.

As a further alternative, the shifter shown in FIG. 3 may be implemented by combining all inputs into each split mode and cascaded multiplexer stage into a single redesigned multiplexer which receives all inputs and controls and selects one output using the same logic described in detail above. For example, the $a_{15}$ bit split mode multiplexer and cascaded multiplexer bit splice of FIG. 6*a* may be implemented in a single multiplexer as shown by the bit splice of FIG. 9. The logic behind the selection of each of the five inputs is indicated in the FIG. 9 in a dotted box enclosing the input. Use of such a multiplexer would require redesigning the standard cascaded multiplexer shifter rather than inserting additional, split mode multiplexers as shown in FIG. 3. However, the single step multiplexer of FIG. 9 may provide additional efficiency in processing time and resources.

Accordingly, the invention has been described by way of illustration rather than limitation.

What is claimed is:

1. An integrated circuit comprising:

a shifter having a given length for shifting a given number of data bits therein;

one or more separators for selectively maintaining said data bits in two or more fields in said shifter, each field defined by a partial length portion of said shifter given length; and one or more controls for controlling said shifter to shift said data bits in each field as separate numbers.

2. An integrated circuit as defined in claim 1, wherein said shifter given length is defined by an even number of bits and said separators selectively maintain said data bits in two equal halves.

3. An integrated circuit as defined in claim 2, wherein said shifter is capable of a double right arithmetic shift.

4. An integrated circuit as defined in claim 2, wherein said shifter is capable of a double left arithmetic shift.

5. An integrated circuit as defined in claim 2, wherein said shifter is capable of a double left logical shift.

6. An integrated circuit as defined in claim 2, wherein said shifter given length is 32 bits and said separators selectively maintain said data bits in two equal 16 bit halves.

7. An integrated circuit as defined in claim 1, wherein said one or more separators comprise a plurality of multiplexers.

8. An integrated circuit as defined in claim 7, wherein said two or more fields comprise at least one upper field and at least one lower field, and wherein said multiplexers comprise an upper field multiplexer and a lower field multiplexer.

9. An integrated circuit as defined in claim 8, wherein said lower field multiplexer receives a plurality of selection inputs and produces an output associated with a shift right function.

10. An integrated circuit as defined in claim 9, wherein said plurality of selection inputs of said lower field multiplexer includes a first data bit from said upper field and one or more second data bits for use in said lower field.

11. An integrated circuit as defined in claim 10, wherein said one or more second data bits comprise a bit storing a value of 0 for use in a logical shift right and a sign bit from said lower field.

12. An integrated circuit as defined in claim 10, wherein said one or more controls comprises a split shift control which controls whether said lower field multiplexer selects said first data bit or one of said one or more second data bits.

13. An integrated circuit as defined in claim 8, wherein said upper field multiplexer receives a plurality of selection inputs and produces an output associated with a shift left function.

14. An integrated circuit as defined in claim 13, wherein said plurality of selection inputs of said upper field multiplexer includes a first data bit from said lower field and one or more second data bits for use in said upper field.

15. An integrated circuit as defined in claim 14, wherein said one or more second data bits comprise a bit storing a value of 0 for use in a logical shift left.

16. An integrated circuit as defined in claim 15, wherein said one or more controls comprise a split shift control which controls whether said upper field multiplexer selects said first data bit or one of said one or more second data bits.

17. An integrated circuit as defined in claim 1, wherein the shifter is a cascade shifter comprising a plurality of multiplexer stages and controls for controlling the shifts at each multiplexer stage.

18. An integrated circuit as defined in claim 17, wherein said cascade shifter causes data in each of the fields to undergo simultaneous shifting at each multiplexer stage.

19. An integrated circuit as defined in claim 17, wherein said shifter is capable of barrel shifting and wherein said one or more separators selectively maintain data bits in two or more field during barrel shifting.

20. An integrated circuit as defined in claim 1, wherein the integrated circuit comprises a digital signal processor.

21. An integrated circuit as defined in claim 1, wherein the integrated circuit comprises a microprocessor.

22. An integrated circuit as defined in claim 1, wherein the integrated circuit comprises a microcontroller.

23. A method of shifting data in a register comprising the steps of:

providing a shifter of a given bit length;

assigning a first data number to a first part of the shifter and a second data number to a second part of the shifter; and shifting each of said first and second data numbers simultaneously within said two parts of said shifter to affect a dual shift function of two distinct data numbers.

24. A method as defined in claim 23, comprising providing said shifter with the given bit length of an even number and wherein said first and second parts are two equal halves of said shifter.

25. A method as defined in claim 23, comprising selectively allowing said shifter to function as a full-length register.

26. A method as defined in claim 25, comprising selecting a split mode for said shifter so as to cause said shifter to be divided into said two fields and inputting two data numbers into the respective fields of said shifter and simultaneously shifting each of said data numbers a given shift amount.

27. A cascaded shifter capable of selective split shift operation of two or more data words, the shifter comprising:

a plurality of cascaded multiplexer stages for selecting one bit at a given bit location from a plurality of inputs based upon one or more shift controls; and multiplexing circuitry for selecting one of said plurality of inputs based upon a split shift control to thereby selectively effect a split shift operation.

28. A shifter as defined in claim 27, wherein the multiplexing circuitry is contained is a plurality of multiplexers separate from the multiplexer stages for receiving a plurality of inputs and selecting one therefrom based at least upon said shift control.

29. A shifter as defined in claim 27, wherein the multiplexing circuitry is contained within said multiplexer stages.

30. A shifter as defined in claim 27, wherein the plurality of inputs includes one or more bits from other bit locations which are selected based upon a barrel shifting control.

* * * * *